United States Patent [19]
Ko

[11] Patent Number: 5,748,119
[45] Date of Patent: May 5, 1998

[54] DEVICES AND METHODS FOR CHANNEL-ENCODING AND CHANNEL-DECODING OF DIGITAL DATA

[75] Inventor: Jung-wan Ko, Suwon, Rep. of Korea

[73] Assignee: Samsung Electronics Co., Ltd., Kyungki-Do, Rep. of Korea

[21] Appl. No.: 715,427

[22] Filed: Sep. 18, 1996

[30] Foreign Application Priority Data

Sep. 18, 1995 [KR] Rep. of Korea ............ 95-30447

[51] Int. Cl.⁶ ............................................. H03M 7/00
[52] U.S. Cl. ........................................ 341/59; 341/58
[58] Field of Search ............................. 341/58, 59, 68, 341/69

[56] References Cited

U.S. PATENT DOCUMENTS

| | | | |
|---|---|---|---|
| 5,375,249 | 12/1994 | Cho | 395/800 |
| 5,506,581 | 4/1996 | Ino et al. | 341/58 |

FOREIGN PATENT DOCUMENTS

| | | | |
|---|---|---|---|
| 0 511 498 | 11/1992 | European Pat. Off. | H03M 5/14 |
| 0 535 560 | 4/1993 | European Pat. Off. | G11B 20/14 |
| 1 575 728 | 9/1980 | United Kingdom | H03K 13/24 |
| WO 96/32779 | 10/1996 | WIPO | H03M 5/14 |

*Primary Examiner*—Jeffrey A. Gaffin
*Assistant Examiner*—Peguy Jean Pierre
*Attorney, Agent, or Firm*—Sughrue, Mion, Zinn, Macpeak & Seas, PLLC

[57] ABSTRACT

Channel-encoding and channel-decoding of a (d, k, m, n) code are disclosed. An m-bit input word is encoded to an (n-d+1)-bit channel word by an encoding table. One or more merge bits are added to each of the encoded channel words so as to form an n-bit channel word. Depending upon detection of violation of d and/or k constraints in the juxtaposition of consecutive channel words in combination with their intervening merge bit(s), certain bits are converted to cause the d and k constraints to both be met, and for the purpose of minimizing the digital sum value (DSV). To decode the channel words thus encoded, n-bit channel words are received and examined as consecutive pairs to determine the states of the merge bit(s) and the identifying bits of each channel word. The identifying bits and/or the last bit of the first channel code and the first bit of the second channel code are converted based on the validity of the d and k constraints. The merge bit(s) are then discarded and the remaining bits of the channel word are decoded into m-bit data using a decoding table.

37 Claims, 2 Drawing Sheets

1

DEVICES AND METHODS FOR CHANNEL-ENCODING AND CHANNEL-DECODING OF DIGITAL DATA

BACKGROUND OF THE INVENTION

The present invention relates to channel-encoding and channel-decoding devices and methods, and more particularly, to simplified devices and methods for channel-encoding and channel-decoding of digital data, in which predetermined code constraints are satisfied and the efficiency of an eight-to-fourteen modulation (EFM) code is increased.

Channel-encoding of digital data is a technique to overcome limitations inherent in a channel or a recording medium and increases the robustness of a system. In an optical recording device, the channel-encoding itself influences recording density, because the minimum number of running zeroes in a channel code has a direct impact on the size of pits.

The most widely known channel-code is the runlength-limited (RLL) code which has a restriction on the minimum number and the maximum number of consecutive 0s between two is in a sequence of code. The number of the consecutive 0s is referred to as runlength.

RLL codes are characterized by parameters. Examples of these parameters include (d, k) and (d, k, m, n), where d indicates a minimum runlength, k indicates a maximum runlength, m indicates the number of bits of data which is input in an encoder, and n indicates the number of bits of a code word which is output from the encoder. Here, d is a factor determining a minimum length of a pit for recording data in an optical recording medium, and larger d values are preferred. However, when d increases with a given n, the number of available code words decreases, leading to a decrease in m. As a result, the value of m/n which indicates the efficiency of an encoder decreases, thereby reducing the rate of output from the encoder.

An EFM code (2, 10, 8, 17) is used for a compact disk. To produce the code, 256 14-bit code words which satisfy the constraints of d=2 and k=10 are selected. To satisfy the runlength constraints when code words are concatenated, 3 merging bits are inserted between code words.

When the d and k constraints are satisfied, the merging bits are inserted to reduce a digital sum variance (DSV) so that the variation of a DC value decreases and recorded signals are reproduced reliably.

The k parameter influences a phase-locked loop which extracts timing information included in a signal during playback. Smaller k values are preferred. However, a decrease in k lowers the efficiency of a code. Since k is less influential on the characteristic of a code than d, a small increase or decrease of k has no significant impact on the characteristic of the code. Further, once k is sufficiently large, the efficiency of the code will increase with k.

The code efficiency significantly influences the efficiency of a recording medium. Since channel-encoding itself increases redundancy, the efficiency of the recording medium increases in proportion to the code efficiency.

Since the EFM code has three merging bits, the code efficiency is 8/17, which is smaller than that of an EFM-plus code or an eight-to-fifteen code. Hence, optical recording devices recently developed adopt codes having a higher code efficiency of 8/16 or 8/15 rather than the EFM code. However, in order to implement such codes, another encoding table, which differs from that used for a compact disk and more complex circuits are required. Thus, the more efficient codes cannot be used in existing recording devices. Further, an interchangeable device capable of playing back a common compact disk format also, must be equipped with one extra decoder to decode these codes.

SUMMARY OF THE INVENTION

To overcome the above problems, it is an object of the present invention to provide channel-encoding and channel-decoding methods which use an EFM code with a reduced number of merging bits, which are compatible with encoders and decoders for conventional EFM code, and increase code efficiency.

It is another object of the present invention to provide devices for encoding and decoding of a highly efficient code by employing simple circuitry.

To achieve the above first object, there is provided a method for channel-encoding of digital data into a (d, k, m, n) code where d indicates a minimum runlength, k indicates a maximum runlength, m indicates the bit number of an input word, and n indicates the bit number of a code word.

The channel-encoding method according to the present invention includes the preliminary steps of encoding each m-bit input word into a channel word (having a length of more than m, but less than n bits) by means of an encoding table, concatenating together two consecutive channel words with one or more merge bits between the channel words (thereby increasing the overall length of a channel word to n bits), and assigning certain bits in each of the consecutive channel words to be "identifying bits." The consecutive bit pattern of the two channel words and the merge bit(s) is adjusted depending on the d (minimum run length) constraint and the k (maximum run length) constraint. Specifically, the last bit of the first channel word, the first bit of the second channel word, and the merge bit(s) are converted in the event the d constraint is violated. Further, the identifying bits and the merge bit(s) are converted in the event the k constraint is violated.

A method of channel-decoding a digital data code according to the above-described (d, k, m, n) coding model is also provided. According to the channel-decoding method of the present invention, n-bit channel words are received and examined as consecutive pairs to determine the states of the merge bit(s) and the identifying bits of each channel word. The identifying bits and/or the last bit of the first channel code and the first bit of the second channel code are converted based on the validity of the d and k constraints. The merge bit(s) are then discarded and the remaining bits of the channel word are decoded into m-bit data using a decoding table.

To achieve the second of the above objects, a device for channel-encoding is provided which encodes digital data by a (d, k, m, n) code. As in the case of the (d, k, m, n) channel-encoding method mentioned above, d indicates a minimum runlength, k indicated a maximum runlength, m indicates the number of bits of an input word, and n indicates the number of bits of a code word. The channel-encoding device according to the present invention has an encoder which encodes an m-bit input word into an (n-d+1)-bit channel code by means of an encoding table. Also included is a first detector which detects a violation of a k constraint by determining a runlength of zeroes in the channel code output from the encoder. Consecutive pairs of code words output by the encoder are held in a first latch and a second latch. A second detector detects a violation of a d constraint from the outputs of the first and second latch means. A converter is controlled by the outputs of the first and second detectors to convert the certain output bits of the first and second latches.

A device for channel-decoding a digital data code according to the above-described (d, k, m, n) coding model is also provided. According to the channel-decoder of the present invention, n-bit channel words are received into a first latch. A second latch receives the code word output from the first latch and separates the merge bit(s) from the output of the first latch. Control signals are generated by determining the states of the identifying bits and the merge bit(s). The outputs of each of the first latch and the second latch are converted based on the generated control signals. The converted channel code output by the second latch is decoded into an m-bit data word by means of a decoding table.

BRIEF DESCRIPTION OF THE DRAWINGS

The above objects and advantages of the present invention will become more apparent by detailed descriptions of preferred embodiments thereof with reference to the attached drawings in which.

DETAILED DESCRIPTION OF THE INVENTION

Figure 1:
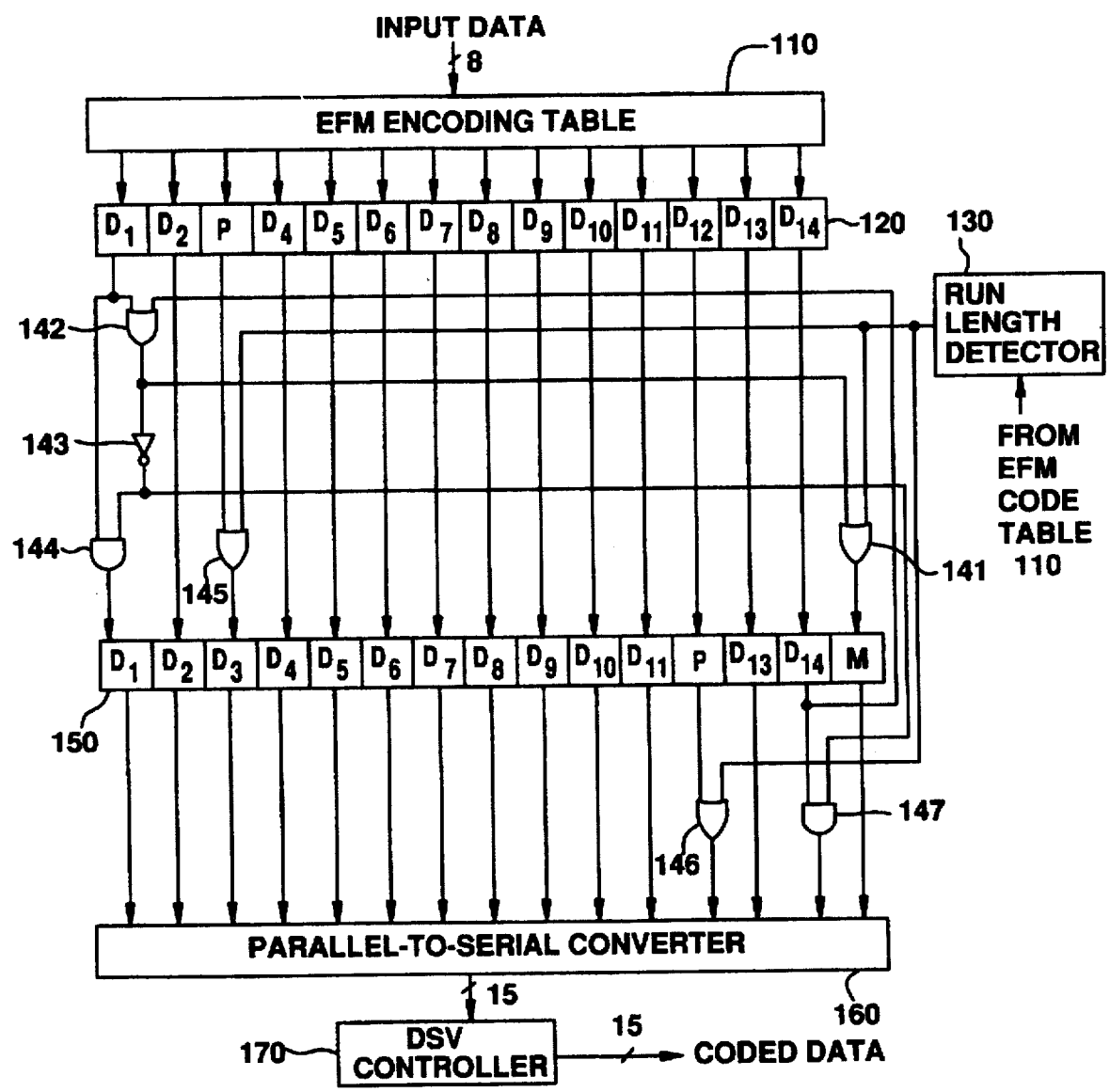
FIG. 1 is a block diagram of a digital data channel encoder according to the present invention.

Constraints and rules required to achieve channel encoding and channel decoding methods suggested in the present invention will be described.

Constraint 1

Let the leading code word of two concatenated code words of (d, k, m, n) format be Cp and the following codeword be Cn. If both the last bit of Cp and the first bit of Cn are is and a single merging bit is added, then a d parameter of 2 cannot be satisfied even if 0 is assigned as the merging bit.

Constraint 2

When the number of 0s between the last "1" bit of Cp and the first "1" bit of Cn is larger than k, the merging sequence should include a "1" to satisfy k.

When both constraints 1 and 2 are satisfied, the merging bit should be determined to reduce the DSV value. A DSV controlling method for decreasing the DSV value is well known to those skilled in the art. Before being recorded in a recording medium, the signal values between the time points of 1 and the next 1 in the signal are converted to 1 or −1. A DSV value indicates the accumulated values of these signals and is altered by inserting one additional bit in the signal to invert the signal. The decrease of the DSV value by this insertion of a 0 or 1 additional bit depending on the DSV value is referred to as DSV control. It is well known that a 3-bit merging sequence is used to perform the DSV control in a conventional compact disk.

Constraint 3

To control the DSV value, a "0" or "1" should be added in an intended position without any impact on a code value or code efficiency. When the d and k constraints are satisfied without regard to the value of the merging bit, the merging bits are used to control the DSV value. Though the DSV control differs among the types of devices, it has been determined experimentally that a DSV control at every 20th code word, on average, prevents the DSV value from increasing to 100 or above. In many cases, however, a DSV controlling bit is inserted in a predetermined position of each code word.

To satisfy the above three constraints by adding a single merging bit, the following encoding and decoding rules are used.

Encoding rules

1. Every 8-bit unit of input data is converted into a 14-bit code word by using an EFM encoding table.

2. Assuming that the leading code word of two consecutive code words is Cp and the following code word is Cn, when both the last bit of Cp and the first bit of Cn are is, a merging bit is set to 1 and the last bit of Cp and the first bit of Cn are converted into 0s.

In other words, if X denotes a bit having an arbitrary value and M denotes the merging bit, the combination of two code words such as

"XXXXXXXXXXXX001M100XXXXXXXXXXXX"

is converted into

"XXXXXXXXXXXX0001000XXXXXXXXXXXX."

3. If the runlength of the combination of two code words Cp and Cn, including the merging bit, is fourteen or more, the merging bit is set to 1 and the twelfth bit of Cp and the third bit of Cn are converted into 1s.

Here, the twelfth bit of Cp and third bit of Cn are referred to as identifying bits P.

For instance, the combination of two code words of

"XXXXX100000000M00000000100XXXX"

is converted into

"XXX001000001001001000100XXXX."

4. If one of the identifying bits of the two concatenated code words Cp and Cn is 0 and all the bits between the identifying bits are also 0s, a 0 or 1 is selected as the merging bit so as to decrease the DSV.

For example, this rule is applied to sequences in the form of

"XXXXXXXXXXXX100M000XXXXXXXXXXXX"

or

"XXXXXXXXXXXX000M001XXXXXXXXXXXX."

A sequence encoded according to the above encoding rules is decoded according to the following rules.

Decoding rules

1. If a merging bit is 1 and both the last bit of Cp and the first bit of cn are 0s, the last bit of Cp and the first bit of Cn are converted into 1s.

2. If the merging bit is 1 and both the identifying bits are 1s, the identifying bits are converted into 0s.

3. The merging bit is removed and the other fourteen bits are decoded to the original data by using an EFM decoding table.

The (2, 13, 8, 15) code which uses the above encoding and decoding rules shows the code efficiency of 8/15 and can share the encoding table with the conventionally known (2, 10, 8, 17) EFM code.

The encoding and decoding rules will be described in more detail.

When k is thirteen, codes having nine consecutive zeroes such as those which follow, are not used so that a k constraint is satisfied when a code word which starts or ends with a "0" is concatenated.

```
10010000000000
00010000000000
10001000000000
01001000000000
00001000000000
00000000001001
00000000001000
00000000010010
00000000010001
00000000010000
```

Thus, in case the k constraint is violated, the number of consecutive 0s in the least significant bit portion of Cp or the most significant bit portion of Cn is at least five.

Since the conventional EFM code is a (2, 10, 8, 17) code, k should be ten or more. However, a k value of 10, 11 or 12 is not proper for DSV control since it is confusing whether identifying bits serve to perform the DSV control or indicate a violation of k. That is, when concatenated sequences are of the types,

```
XXX00100000000M00100XXXXXXXXX
XXXXXXXXX00100M00000000100XXX
XXX00100000000M000100XXXXXXXX
XXXXXXXX001000M00000000100XXX
XXX00100000000M0000100XXXXXXX
XXXXXXX0010000M00000000100XXX
XXXX001000000M000100XXXXXXXX
XXXXXXXX001000M0000000100XXXX
XXXX0010000000M000100XXXXXXXX
XXXXXXXX0010000M0000000100XXXX
XXXXX001000000M0000100XXXXXXX
XXXXXXX0010000M000000100XXXXX
``` one of the identifying bits cannot be converted into a "1." Hence, after the other identifying bit is converted, the concatenated sequence will have the form of

XXXXXXXXX00100 1000XXXXXXXXXX or

XXXXXXXXXX000 100100XXXXXXXXX

As a result, the identifying and merging bits for indicating a violation of k cannot be differentiated from those for controlling the DSV value.

If k is changed to thirteen to solve this problem, the increase of k has no significant impact on the characteristic of the code, as described above.

If k is thirteen, the identifying bits of Cp and Cn can always be converted to is when the k constraint is violated. That is, in all the concatenated sequences where the k constraint is violated, at least the last five Cp and the first five Cn are 0s. Thus, unlike the cases described above, the twelfth bit of Cp and the third bit of Cn are converted into is, the d constraint is satisfied.

Further, to satisfy the constraint of d=2, if either of the last two bits of Cp is a 1, the twelfth bit of Cp should be 0; and if either of the first two bits of Cn is a 1, the third bit of Cn should be a 0.

Accordingly, the merging bit is set to 1 if the d or k constraint is violated. Beyond this, the twelfth bit of Cp and the third bit of Cn are converted into is when k is violated and the last bit of Cp and the first bit of Cn are converted into 0s when d is violated. Thus, when the merging bit is 1, it can be determined which constraint was violated by determining whether the twelfth bit of Cp and the third bit of Cn are 1s or the last bit of Cp and the first bit of Cn are 1s.

In these two cases where the k or d constraint is violated, the decoder can use the EFM decoding table to decode the code word if it recovers converted bits according to the decoding rules described above before decoding.

In order to control the DSV value, the merging bit should be converted into 1 or 0 depending on the DSV value. When the merging bit is 1, it must be discriminated from the case for satisfying the d and k constraints. The decoder determines that the merging bit is set to 1 for DSV control when either the twelfth bit of Cp or third bit of Cn is a 1. Consequently, when the merging bit is 1, the decoder determines which bit to convert on the basis of the twelfth bit of Cp and the third bit of Cn. This explains why the twelfth bit of Cp and the third bit of Cn are referred to as identifying bits.

In addition, when k is satisfied and there are more than five 0s on both sides of the merging bit, for example,

XXXXXXXXX00000M00000XXXXXXXXX,"

an additional DSV control can be performed by converting the merging bit, the twelfth bit of Cp and the third bit of Cn into is or leaving them as 0s according to the DSV.

These kinds of conversion are possible only when, the twelfth bit of Cp, and the third bit of Cn do not result in a violation of the d and k constraints.

Particularly, when they are all converted into 1s, the result is the same as that of a code conversion with a violation of the k constraint. Therefore, there is no need for an additional circuit or to change the decoding rules in recovering the converted bits.

In this case, since a runlength of eleven or more is divided into shorter runlengths of about four, the waveform of a signal becomes more stable.

When DSV control is not performed, coding parameters can be changed to (2, 11, 8, 15) by modifying the encoding and decoding rules as follows.

Encoding rules without DSV control

1. Every 8-bit unit of input data is converted into a 14-bit code word by using an EFM encoding table.

2. Assuming that the leading code word of two consecutive code words is Cp and the following code word is Cn, when both the last bit of Cp and the first bit of Cn are ones, a merging bit is set to 1 and the last bit of Cp and first bit of Cn are converted into 0s.

3. If the runlength of the combination of two code words Cp and Cn including the merging bit is larger than twelve, the merging bit is set to "1" and either the twelfth bit of Cp or the third bit of Cn is converted into a "1" only when such a change does not violate d.

Rules for decoding a sequence encoded by the above encoding rules are as follows.

Decoding rules without DSV control

1. If the merging bit is a 1, and both the last bit of Cp and the first bit of Cn are 0s, the last bit of Cp and the first bit of Cn are converted into 1s.

2. If the merging bit is 1 and at least one of the twelfth bit of Cp and third bit of Cn is a 1, both the twelfth bit of Cp and third bit of Cn are converted into 0s.

3. The merging bit is removed and the other fourteen bits are decoded to the original data by using an EFM decoding table.

The above rules are altered when k is violated. That is, since k is limited to eleven, if the runlength of a concatenated sequence is twelve or thirteen, it is possible that Cp ends with "1000" or "10000" or Cn begins with "0001" or "00001." Here, some cases occur when neither the twelfth bit of Cp nor third bit of Cn can be converted into 1.

Though the EFM code satisfies the constraint of k=10, k is set to eleven to prevent a decoder from making errors. That is, when code words are concatenated as

"XXX00100000000M00100XXXXXXXXX"

or

"XXXXXXXXX00100M00000000100XXX,"

the decoder makes the error of converting all the identifying bits into 0s. Therefore, k is changed into eleven to avoid the above cases.

It is clear that when data is encoded as described, decoding should be performed according to the above decoding rules. That is, when there is no need for a DSV control, k can be reduced to eleven. However, the additional DSV control described above is possible in this case, too.

The encoding and decoding method according to the above rules can be used in case that d is 2 or more and n is at least two times of d+1 as well as in encoding and decoding devices which can share the encoding table with the EFM encoding.

A generalized encoding rule uses the (n-d)th bit of Cp and the (d+1)th bit of Cn as identifying bits. To satisfy the k constraint, the identifying bits and one bit of a merging bit are converted depending on the runlength of a concatenated sequence. To satisfy the d constraint, the identifying bits and the last bit of Cp and first bit of Cn are converted depending on the runlength. Thus, a code can be produced in which a DSV value is controlled and the d and k constraints are satisfied.

The positions for the identifying bits were obtained on the basis of the d constraint so that when k is violated due to d, setting identifying bits to 1s would not violate the d constraint. The (d+1)th bits from the merging bit do not violate d constraint when the bits and the merging bit are converted into 1s. Also, when the d constraint is violated, the identifying bit remains 0 even when neither of the adjacent bits to an identifying bit is 1.

The k parameter should always be larger than the sum of the number of merging bits and the maximum run length of a code excluding the merging bit. Further, since d should not be violated when the identifying bits and one of the merging bits are converted into is for DSV control, k should be larger than a number which is smaller than Expression 1 by one.

$$2d+MBN+1 \; d+2 \quad (1)$$

where the first 2d indicates a minimum number of 0s which do not lead to a violation of d in the bits to the left of the identifying bit of a leading code word of a concatenated sequence and the bits to the right of the identifying bit of a following code word when the identifying bits are is; MBN is the number of merging bits; and 2d+2 indicates the number of zeroes which do not lead to a violation of d in the bits between the merging bit and the identifying bits.

In the encoding table, the number of 0s from a starting 0 to the first 1 in Cp or Cn, or the number of 0s from the last 1 of Cp or Cn to the ending 0 are termed boundary runlengths or boundary k constraints, and is defined as kb.

$$kb+MBN+2d+1 \quad (2)$$

When the result of Expression 2 is larger than that of Expression 1, k should be larger than a number which is smaller than the result of Expression 2 by one. This is because Expression 2 is a minimum number of 0s which satisfies kb and solves problems inherent in a violation of k without violating d.

If the k parameter of the encoding table is kt and kt is larger than the result of Expression 1 or 2, kt becomes k of a final code. In short, the k of a code should be larger than the largest of Expressions 3, 4 and 5.

$$(2d+MBN+2d+2)-1 \quad (3)$$

$$(kb+MBN+2d+1)-1, \text{ or} \quad (4)$$

$$kt \quad (5)$$

A minimum number of merging bits in a merging sequence is a minimum number of 0s which can settle any violation of d, except for "1 M1" in the concatenated sequence, when both the identifying bits are set to 0s. In other words, the minimum number of merging bits in a merging sequence is d-1.

A minimum of k when DSV control is not performed is determined to be the largest of Expressions 5, 6 and 7.

$$kb+MBN+d \quad (6)$$

$$3d+1+MBN \quad (7)$$

In the (2, 13, 8, 15) code described above which uses the EFM encoding table, k was set to thirteen according to the result of Expression 2.

For another example, a (3, 12, 8, 19) code can be constructed. In this case, a merging sequence has two bits. When d is violated, i.e., both the last bit of Cp and the first bit of Cn are is, the first bit of the merging sequence is set to 1 and the last bit of Cp and the first bit of Cn are converted into 0s. When k is violated, the first bit of the merging sequence is set to 1 and the fourth bits from the merging sequence of Cp and Cn, respectively, are converted into 1s.

This code is more powerful in DSV control than that of d=2. This is because, if d and k are satisfied regardless of the merging bit, the case where the merging bit is set to 1 for DSV control can be discriminated from other cases by using the second bit of the merging bit as a DSV control flag. Therefore, the DSV value can be controlled more frequently than in the case of d=2.

Decoding is performed by recovering the converted bits of a channel code on the basis of the merging bits and the identifying bits as described in connection with the d=2 cases. An encoding table for d=3, m=8 and n=19 has 256×19 bits.

Conventionally, a code efficiency is increased by assigning a plurality of data information to a channel code and considering state transition as well since the number of available codes is limited. In contrast, a new method suggested in the present invention is simple in principle and structure and provides a more efficient code.

Now, embodiments of devices for encoding and decoding of digital data will be described with reference to FIGS. 1 and 2.

In FIG. 1, input data is converted into a 14-bit channel code word by using a conventional EFM encoding table 110. The EFM encoding table 110 is generally stored in a ROM and can be referred to as a real encoder. The output of the EFM encoding table 110 is stored in a Cn register 120. After the conversion of the first and third bits, the output of the Cn register 120 are stored as the previous code word Cp in a Cp register 150. The Cn and Cp registers 120 and 150 are comprised of D flip-flops. Here, the Cp register 150 is fifteen bits long and stores a merging bit M in the fifteenth bit.

A runlength detector 130, which detects the runlengths of the channel codes received in the Cp and Cn registers 120 and 150, detects the number of consecutive 0s in the output of the EFM encoding table 110, and determines whether the constraint of k is violated. A general counter can be used as the run-length detector 130, which increments its counted value by one when a "0" is input and is reset when a "1" is input. This is well known to anyone skilled in the art.

When the k constraint is violated, the run-length detector 130 outputs a "1" to OR gates 141, 145 and 146. Thus, in the case of the violation of the k constraint, the output of the OR gate 141 is always "1" and input to the fifteenth bit of the Cp register 150. The twelfth bit of Cp is input to the other input of the OR gate 146 and the third bit of Cn is input the other input of the OR gate 145. In this circumstance, outputs of the OR gates 145 and 146 are 1s.

When the d constraint is violated, the fourteenth bit of the Cp register 150 and the first bit of the Cn register 120 are 1s, and thus an AND gate 142 outputs 1, which serves as a signal indicating the violation of the d constraint. That is, the AND gate 142 functions to detect the violation of the d constraint. The output of the AND gate 142 is input to the other input of the OR gate 141 thereby changing the merging bit M to 1. The output of the AND gate 142 is inverted in an inverter 143 and input to AND gates 144 and 147 to convert the last bit of the code Cp and the first bit of the code Cn into 0s. The output of the Cp register 150 is converted into a sequence of n-bit code words in a parallel-to-serial converter 160. The converted code word is input to a DSV controller 170 for controlling a DSV value under the aforementioned constraints, and output encoded data.

Figure 2:
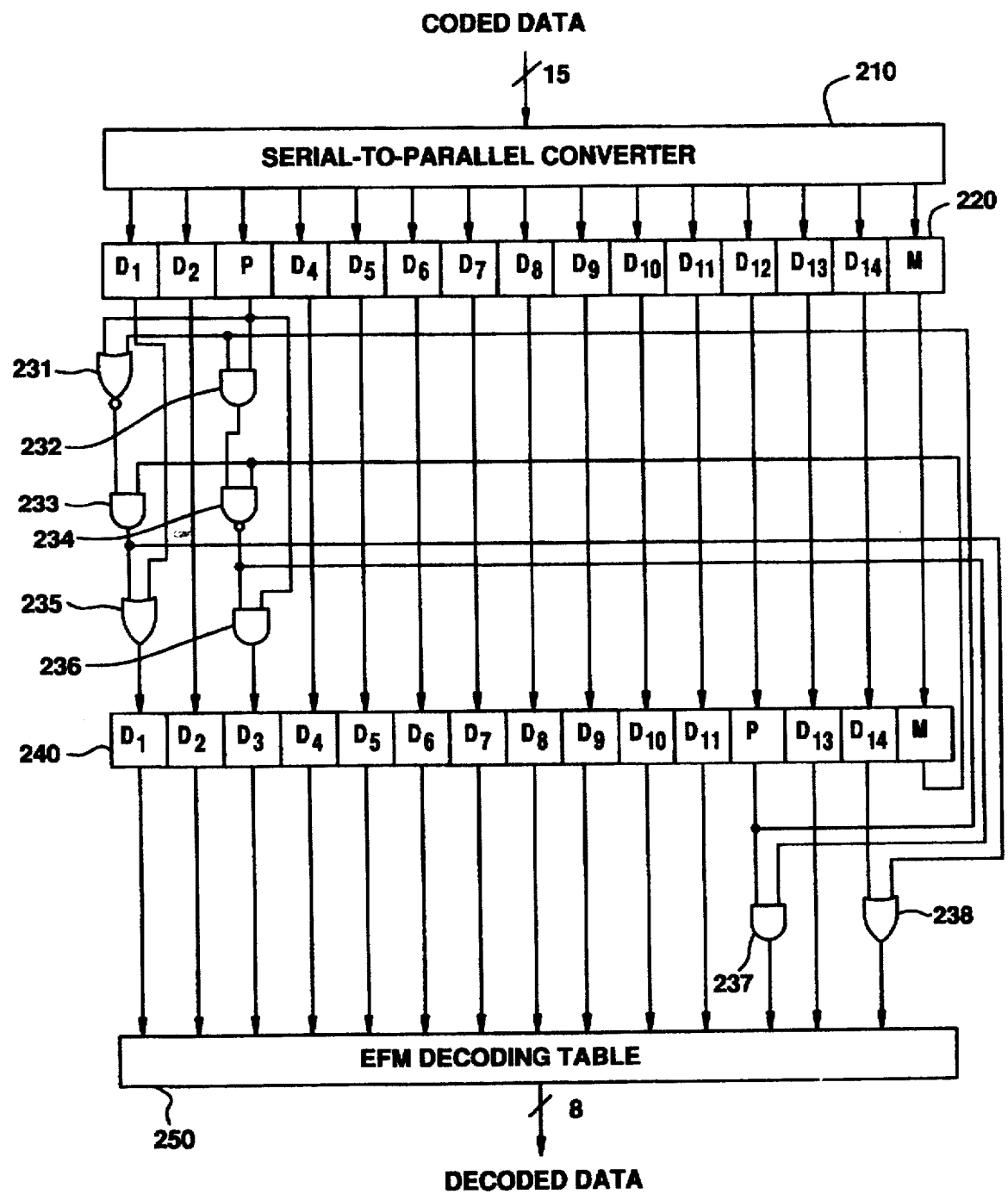
FIG. 2 is a block diagram of a digital data channel decoder according to the present invention.

FIG. 2 illustrates a decoder of the present invention. The operation of the decoder will be described referring to the figure.

In FIG. 2, coded data is input to a serial-to-parallel converter 210. Here, if data was modulated by non-return-to-zero inverted (NRZI) modulation during recording, the NRZI data is recovered to original nonreturn-to-zero (NZR) data during playback and then input to the serial-to-parallel converter 210.

The serial-to-parallel converter 210 converts the serial code word in a 15-bit unit of a parallel data. The parallel code word is stored in a Cn register 220. Then, the output of the Cn register 220 is sequentially converted according to the state of a merging bit M, and input to a Cp register 240.

More specifically, the identifying bits, which are the twelfth bit of the Cp register 240 and the third bit of the Cn register 220, and the merging bit serve to determine which channel bits are converted. To implement the determinations based on these bits, the twelfth bit of the Cp register 240 and the third bit of the Cn register 220 are input to an AND gate 232 and a NOR gate 231. Thus, the AND gate 232 outputs 1 when both these identifying bits are is, and the NOR gate 231 outputs 1 when they are both 0s.

The output of the AND gate 232 is input to a NAND 234. The last bit of the Cp register 240, i.e., the merging bit M, is input to the other input of the NAND gate 234. When the merging bit is "1" and the output of the AND gate 232 is "1" (that is, when both the twelfth bit of the Cp register 240 and the third bit of the Cn register 220 are is), the NAND gate 234 outputs 0.

When the output of the NAND gate 234 is 0, AND gates 236 and 237 convert the twelfth bit of the Cp register 240 and the third bit of the Cn register 220 into 0s.

In short, when the identifying bits of the two input codes Cp and Cn and the merging bit are is, which indicates that the k constraint is not satisfied during the decoding, the AND gates 232, 236 and 237 and the NAND gate 234 convert both the identifying bits into 0s.

Meanwhile, an AND gate 233 outputs 1 when the merging bit is "1" and both the twelfth bit of the Cp register 240 and the third bit of the Cn register 220 are 0s. When the AND gate 233 outputs 1, OR gates 235 and 238 convert the last bit of the Cp register 240 and the first bit of the Cn register 220, which are 0s, are into 1s.

In short, the NOR gate 231, AND gate 233 and OR gates 235 and 238 convert the last bit of the Cp register 240 and the first bit of the Cn register 220 into 1s when the merging bit is "1" and the identifying bits are 0s, which indicates that the d constraint is not satisfied.

The output of the Cp register 240, which is converted depending on the states of the twelfth bit of the Cp register 240 and the third bit of the Cn register 220, is decoded to the original data through a conventional EFM decoding table 250. The EFM decoding table 250 is stored in a ROM and can be referred to as a real decoder.

In the present invention, the efficiency of the EFM code used in a compact disk is increased. With the EFM code, encoding and decoding devices are constituted more simply than with an EFM-plus code or an 8-15 code having a code efficiency similar to that of the EFM code. Also, the present invention can be used in an optical recording device, which is compatible with a conventional compact disk player and decoder.

As described above, since the present invention shares the encoding and decoding tables with an EFM code, required circuitry is reduced in fabrication of an interchangeable device capable of reproducing a compact disk. Further, code efficiency is improved, which makes the present invention suitable for high-density recording.

What is claimed is:

1. A method for channel-encoding digital data into a (d, k, m, n) code where d indicates a minimum runlength constraint, k indicates a maximum runlength constraint, m indicates a number of bits of an input word, and n indicates a number of bits of a code word, said method comprising the steps of:

(a) encoding at least one m-bit input word into a channel code having more than m but less than n bits by using a predetermined encoding table;

(b) concatenating two consecutive channel codes, provided by said encoding step, by adding a (d−1)-bit merging sequence to produce n-bit code words;

(c) assigning the (n-d)th bit of a first channel code of said consecutive channel codes and the (d+1)th bit of a second channel code of said consecutive channel code as identifying bits; and (d) adjusting said two consecutive channel codes and said merging sequence depending on d and k constraints; wherein the merging sequence and the last bit of said first channel code and the first bit of said second channel code are converted when said d constraint is violated, and said identifying bits and said merging sequence are converted when said k constraint is violated.

2. A method for channel-encoding digital data as claimed in claim 1, wherein said step (d) comprises the steps of:

(d1) determining that said d constraint is violated when both the last bit of said first channel code and the first bit of said second channel code are 1s;

(d2) assigning a 1 value to one bit of said merging sequence and converting the last bit of said first channel code and the first bit of said second channel code into 0s when it is determined that said d constraint is violated in said step (d1);

(d3) determining that said k constraint is violated when a runlength of a sequence of said two consecutive channel codes concatenated by said merging sequence is larger than k;

(d4) assigning a 1 value to one bit of said merging sequence, and converting identifying bits into 1s when it is determined that said k constraint is violated in said step (d3); and (d5) assigning 0s to all bits of the merging sequence when it is determined that said d and k constraints are not violated in said steps (d1) and (d3).

3. A method for channel-encoding digital data as claimed in claim 1, wherein a value of d is two or more.

4. A method for channel-encoding digital data as claimed in claim 1, wherein a value of d is two.

5. A method for channel-encoding digital data as claimed in claim 4, wherein k=11, m=8, and n=15.

6. A method for channel-encoding digital data as claimed in claim 1, wherein k is equal to or larger than the largest of the following expressions:

(2d+number of merging bits+2d+2)−1     (1)

(kb+number of merging bits+2d+1)−1     (2)

kt     (3)

where kt is a maximum runlength in the predetermined encoding table, and kb is a boundary runlength in the encoding table, and wherein both of said identifying bits are converted into 1s when the k constraint is violated in said step (d).

7. A method for channel-encoding digital data as claimed in claim 6, wherein the d value is two.

8. A method for channel-encoding digital data as claimed in claim 7, wherein k=13, m=8, and n=15.

9. A method for channel-encoding digital data as claimed in claim 7, further comprising the step (e) of using said merging bit for DSV control if a concatenated sequence is of a type:

"XXXXXXXXXXX000M001XXXXXXXXXX"

or

"XXXXXXXXXXX100M000XXXXXXXXXX"

where X indicates a bit of a-arbitrary value and M corresponds to a merging sequence.

10. A method for channel-encoding digital data as claimed in claim 9, wherein said merging sequence and said identifying bits are converted into 0s to perform DSV control when said k constraint is not violated.

11. A method for channel-encoding digital data as claimed in claim 9, wherein said merging sequence and said identifying bits are converted into 1s to perform DSV control when said k constraint is not violated.

12. A method for channel-encoding digital data as claimed in claim 9, wherein the first bit of said (d−1)-bit merging sequence is converted into 1 when said d and k constraints are violated.

13. A method for channel-encoding digital data as claimed in claim 12, wherein said (d−1)-bit merging sequence is "10" when said d and k constraints are violated and the minimum runlength is 3.

14. A method for channel-encoding digital data as claimed in claim 13, wherein k=12, m=8, and n=19.

15. A method for channel-encoding digital data as claimed in claim 14, wherein said (d−1)-bit merging sequence is converted into "00" to perform DSV control when said d and k constraints are satisfied regardless of the state of said merging sequence in said step (e).

16. A method for channel-encoding digital data as claimed in claim 14, wherein said (d−1)-bit merging bit is converted into "01" to perform DSV control when said k constraint is satisfied, regardless of the state of said merging sequence in said step (e).

17. A method for channel-encoding digital data as claimed in claim 1, wherein an EFM encoding table is used in said step (a).

18. A method for channel-encoding digital data into a code of (d, k, m, n) where d indicates a minimum runlength constraint, k indicates a maximum runlength constraint, m indicates a number of bits of an input word, and n indicates a number of bits of a code word, said method comprising the steps of:

(a) encoding at least one m-bit input word into an (n−d+1)-bit channel code by using a predetermined encoding table;

(b) concatenating two consecutive channel codes provided by said encoding step by adding a (d−1)-bit merging sequence to produce an n-bit code word;

(c) assigning the (n−d)th bit of a first channel code of said consecutive channel codes and the (d+1)th bit of a second channel code of said consecutive channel codes as identifying bits;

(d) adjusting said two consecutive channel codes and said merging sequence depending on d and k constraints; wherein the merging sequence and the last bit of said first channel code and the first bit of said second channel code are converted when said d constraint is violated, and said identifying bits and said merging sequence are converted when said k constraint is violated;

(e) controlling a DSV value by converting said identifying bits and said merging sequence depending on said identifying bits and said k and d constraints.

19. A method for channel-encoding digital data as claimed in claim 18, wherein said merging sequence is converted to control said DSV value when one of said identifying bits is "1" and all the bits between said identifying bits are 0s in said step (e).

20. A method for channel-encoding digital data as claimed in claim 18, wherein said identifying bits and said merging sequence are all converted into 1s to control said DSV value when a runlength of said merging 5 sequence and bits adjacent to said merging sequence is k in said step (e).

21. A method for channel-encoding digital data as claimed in claim 18, wherein said identifying bits and said merging sequence are converted into 0s to control said DSV value when a runlength of said merging sequence and bits adjacent to said merging sequence is k in said step (e).

22. A method for channel-decoding digital data coded by (d, k, m, n) code where d indicates a minimum runlength constraint, k indicates a maximum runlength constraint, m indicates a number of bits of an input s word, and n indicates a number of bits of a code word, said method comprising the steps of:

(a) receiving at least one n-bit code word;

(b) determining the states of a (d–1)-bit merging sequence added to concatenate two consecutive channel codes in the code word received in said step (a) and identifying bits which are the (n–d)th bit of a first channel code of said two consecutive channel codes and the (d+1)th bit of a second channel code of said two consecutive channel codes, and converting said identifying bits and the last bit of said first channel code and the first bit of said second channel code depending on the satisfaction of said d and k constraints; and (c) separating said merging sequence from said code word converted in said step (b), and decoding said code word into original m-bit data by using a predetermined decoding table.

23. A method for channel-decoding digital data as claimed in claim 22, wherein the last bit of said first channel code and the first bit of said second channel code are converted into "1"s when a predetermined bit of said (d–1)-bit merging sequence is "1 " and said identifying bits of said two consecutive channel codes are "0"s in said step (b), and said identifying bits are converted into "0"s when said predetermined bit of said (d–1)-bit merging sequence is "1" and at least one of said identifying bits is "1", in said step (b).

24. A method for channel-decoding digital data as claimed in claim 22, wherein an EFM decoding table is used in said step (c).

25. A method for channel-encoding digital information by a (d, k, m, n) code and decoding a code word into original digital information, where d indicates a minimum runlength constraint, k indicates a maximum runlength constraint, m indicates a number of bits of an input word, and n indicates a number of bits of said code word, said method comprising the steps of:

(a) encoding at least one m-bit input word into a channel code having m bits but less than n bits by use of a predetermined encoding table;

(b) concatenating two consecutive channel codes by adding a (d–1)-bit merging sequence to get an n-bit code word;

(c) assigning the (n–d)th bit of a first channel code of said consecutive channel codes and the (d+1)th bit of a second channel code of said consecutive channel codes as identifying bits;

(d) adjusting said two consecutive channel codes and said merging sequence depending on d and k constraints; wherein the merging sequence and the last bit of said first channel code and the first bit of said second channel code are converted when said d constraint is violated, and said identifying bits and said merging sequence are converted when said k constraint is violated;

(e) transmitting an n-bit code word;

(f) receiving said transmitted n-bit code word;

(g) determining the states of said (d–1)-bit merging sequence and the identifying bits which are the (n–d)th bit of the first channel code of said two consecutive channel codes and the (d+1th bit of the second channel code, and converting said identifying bits and the last bit of said first channel code and the first bit of said second channel code depending on the satisfaction of said d and k constraints; and (h) separating said merging sequence from said code word to get channel codes, and decoding said channel codes into original m-bit data by using a predetermined decoding table.

26. A method for channel-encoding digital data by a (d, k, m, n) code and decoding a code word into original digital data, where d indicates a minimum runlength constraint, k indicates a maximum runlength constraint, m indicates a number of bits of an input word, and n indicates a number of bits of said code word, said method comprising the steps of:

(a) encoding at least one m-bit input word into an (n–d+1)-bit channel code by using a predetermined encoding table;

(b) concatenating two consecutive channel codes by adding a (d–1)-bit merging sequence to produce an n-bit code word;

(c) assigning the (n–d)th bit of a first channel code of said consecutive channel codes and the (d+1)th bit of a second channel code of said consecutive channel codes as identifying bits;

(d) adjusting said channel codes and said merging sequence depending on the d and k constraints; wherein the merging sequence and the last bit of said first channel code and the first bit of said second channel code are converted when said d constraint is violated, and said identifying bits and said merging sequence are converted when said k constraint is violated;

(e) converting said identifying bits and said merging bit depending on said identifying bits and said k and d constraints, thereby controlling a DSV value;

(f) transmitting said n-bit code word whose DSV value is controlled in said step (e);

(g) receiving said transmitted n-bit code word;

(h) determining the states of said (d–1)-bit merging sequence and the identifying bits which are the (n–d)th bit of the first channel code of said two consecutive channel codes and the (d+1)th bit of the second channel code, and converting said identifying-bits and the last bit of said first channel code and the first bit of said second channel code depending on the validity of said d and k constraints; and (i) separating said merging sequence from said code word to get channel codes, and decoding said channel codes into original m-bit data by using a predetermined decoding table.

27. A device for channel-encoding digital data with a (d, k, m, n) code where d indicates a minimum runlength constraint, k indicates a maximum runlength constraint, m indicates a number of bits of an input word, and n indicates a number of bits of a code word, said device comprising:

an encoder for encoding at least one m-bit input word into an (n–d+1)-bit channel code by using a predetermined encoding table;

first latch means for latching a current channel code output from said encoder;

second latch means for latching an n-bit code word which is the output of said first latch means extended by a (d–1)-bit merging sequence;

first detecting means for detecting a violation of the k constraint by determining a runlength of zeroes in said channel code output from said encoder;

second detecting means for detecting a violation of the d constraint from the outputs of said first and second latch means; and means for converting the outputs of said first and second latch means and said merging sequence depending on the outputs of said first and second detecting means.

28. A device for channel-encoding digital data as claimed in claim 27, further comprising serial-to-parallel converting means for converting the output of said second latch means into a serial n-bit code word.

29. A device for channel-encoding digital data as claimed in claim 27, further comprising means for controlling a DSV value of the output of said second latch means.

30. A device for channel-encoding digital data as claimed in claim 27, wherein said second detecting means comprises a first logic circuit for outputting a "1" indicating a violation of said d constraint when the last bit of said second latch means and the first bit of said first latch means are "1"s.

31. A device for channel-encoding digital data as claimed in claim 30, wherein said converting means converts said merging sequence, and the identifying bits which correspond to a (d+1)th bit of said first latch means and a (n−2d+1)th bit of said second latch means, or the first bit of said first latch means and the last bit of said second latch means, depending on the outputs of said first and second detecting means.

32. A device for channel-encoding digital data as claimed in claim 31, wherein said converting means comprises:

a second logic circuit for setting said merging sequence to 1 when at least one of the outputs of said first logic circuit and said first detecting means is "1";

an inverting circuit for inverting the output of said first logic circuit when said d constraint is violated;

a third logic circuit for converting the first bit of said first latch means, and said merging bit and the (n−d+1)-th bit of said second latch means depending on the output of said inverting circuit; and a fourth logic circuit for converting the (d+1)th bit of said first latch means and the (n−2d+1)th bit of said second latch means depending on the output of said first detecting means.

33. A device for channel-decoding digital data coded by a (d, k, m, n) code where d indicates a minimum runlength constraint, k indicates a maximum runlength constraint, m indicates a number of bits of an input word, and n indicates a number of bits of a transmitted code word, said device comprising:

first latch means for storing an n-bit input code word;

second latch means for storing said code word output from said first latch means and separating a (d−1)-bit merging sequence from the output of said first latch means;

control signal generating means for determining the states of identifying bits, which are the (d+1)th bit of is said first latch means and the (n−2d+1)th bit of said second latch means, and said merging sequence, to generate a control signal in response to said determination;

means for converting the outputs of said first and second latch means according to said control signal; and a decoder for decoding said converted channel code output from said second latch means into original m-bit data by using a predetermined decoding table.

34. A device for channel-decoding digital data as claimed in claim 33, further comprising serial-to-parallel converting means for converting a received serial code word into a parallel n-bit code word and providing said converted code word to said first latch means.

35. A device for channel-decoding digital data as claimed in claim 34, wherein said control signal generating means comprises:

a first logic circuit for outputting a "1" when both the identifying bits of said two consecutive channel codes are both "0"s;

a second logic circuit for outputting a "1" when said identifying bits are both "1"s; and a third logic circuit for generating a control signal for converting a code according to the determination of said second logic circuit and the state of said merging sequence.

36. A device for channel-decoding digital data as claimed in claim 35, wherein said converting means comprises a fourth logic circuit for converting the outputs of said first and second latch means corresponding to a code to be converted and responding to said control signal output from said third logic circuit.

37. A device for channel-encoding digital data with a (d, k, m, n) code and channel-decoding a code word into original digital data where d indicates a minimum runlength constraint, k indicates a maximum runlength constraint, m indicates a number of bits of an input word, and n indicates a number of bits of said code word, said device comprising:

an encoder for encoding at least one m-bit input word into an (n−d+1)-bit channel code by using a predetermined encoding table;

first latch means for latching a current channel code output from said real encoder;

second latch means for latching an n-bit code word which is the output of said first latch means extended by is a (d−1)-bit merging sequence;

first detecting means for detecting a violation of the k constraint by determining a runlength of 0s in said channel code output from said encoder;

second detecting means for detecting a violation of the d constraint from the outputs of said first and second latch means;

first converting means for converting the outputs of said first and second latch means and said merging sequence depending on the outputs of said first and second detecting means;

means for transmitting said n-bit code word output from said first converting means;

means for receiving said n-bit code word;

third latch means for storing said received n-bit code word;

fourth latch means for storing said code word output from said third latch means and separating the (d−1)-bit merging sequence from the output of said third latch means;

means for determining the states of identifying bits which correspond to the (d+1)th bit of said third latch means and the (n-2d+1)th bit of said fourth latch means, and said merging-sequence, to generate a control signal in response to said determination;

second converting means for converting the outputs of said third and fourth latch means according to said control signal; and a decoder for decoding said converted channel code output from said fourth latch means into original m-bit data by using a predetermined decoding table.

* * * * *